(12) United States Patent
Chen et al.

(10) Patent No.: US 8,957,359 B2
(45) Date of Patent: Feb. 17, 2015

(54) COMPACT IN-PIXEL HIGH DYNAMIC RANGE IMAGING

(71) Applicant: OmniVision Technologies, Inc., Santa Clara, CA (US)

(72) Inventors: Gang Chen, San Jose, CA (US); Duli Mao, Sunnyvale, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 229 days.

(21) Appl. No.: 13/651,092

(22) Filed: Oct. 12, 2012

(65) Prior Publication Data

US 2014/0103189 A1    Apr. 17, 2014

(51) Int. Cl.
*H01L 27/146* (2006.01)

(52) U.S. Cl.
USPC ................. 250/208.1; 348/308; 257/292

(58) Field of Classification Search
CPC ............ H01L 27/146; H01L 27/14601; H01L 27/14609; H01L 27/14806; H01L 31/00; H04N 5/335; H04N 5/355; H04N 5/3559
USPC ........ 250/208.1, 214.1, 214 R; 348/241, 297, 348/300, 308, 311; 257/291, 292, E27.13, 257/E27.132, E27.133
See application file for complete search history.

(56) References Cited

U.S. PATENT DOCUMENTS

| 2004/0067600 A1* | 4/2004 | Chatterjee ........................ 438/14 |
| 2005/0052554 A1* | 3/2005 | Sakurai et al. ................. 348/301 |
| 2009/0303371 A1* | 12/2009 | Watanabe et al. ............. 348/311 |

* cited by examiner

*Primary Examiner* — Kevin Pyo
(74) *Attorney, Agent, or Firm* — Blakely Sokoloff Taylor & Zafman LLP

(57) ABSTRACT

Embodiments of the invention describe providing a compact solution to provide high dynamic range imaging (HDRI or simply HDR) for an imaging pixel by utilizing a control node for resetting a floating diffusion node to a reference voltage value and for selectively transferring an image charge from a photosensitive element to a readout node. Embodiments of the invention further describe control node to have to a plurality of different capacitance regions to selectively increase the overall capacitance of the floating diffusion node. This variable capacitance of the floating diffusion node increases the dynamic range of the imaging pixel, thereby providing HDR for the host imaging system, as well as increasing the signal-to-noise ratio (SNR) of the imaging system.

18 Claims, 6 Drawing Sheets

COMPACT IN-PIXEL HIGH DYNAMIC RANGE IMAGING

FIELD

Embodiments of the invention generally pertain to image capture devices, and more particularly, but not exclusively, to enhancing the dynamic range of image capture devices.

BACKGROUND

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example, a mobile phone, a computer, a digital camera or a medical device.

As pixel cells become smaller, it becomes more difficult for the pixel cell to output a signal of adequate strength that can be easily deciphered by downstream signal processing. Moreover, there are demands on the image sensor to perform over a large range of lighting conditions, varying from low light conditions to bright light conditions. This performance capability is generally referred to as having high dynamic range imaging (HDRI or alternatively just HDR). Thus, prior art solutions for decreasing the size of the pixel cell limit the dynamic range of the pixel cell.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the invention describe providing a compact solution to provide high dynamic range imaging (HDRI or simply HDR) for an imaging pixel by utilizing a control node for resetting a floating diffusion node to a reference voltage value and for selectively transferring an image charge from a photosensitive element to a readout node.

Embodiments of the invention further describe control node to have to a plurality of different capacitance regions to selectively increase the overall capacitance of the floating diffusion node. In some embodiments, said capacitance regions only turn "on" (i.e., changes the overall capacitance of the floating diffusion node) when the voltage at the floating diffusion node (or a voltage difference between a gate node and the floating diffusion node) is greater than a threshold voltage of the capacitance region; before the capacitance region is "on" it does not contribute to the overall capacitance or conversion gain of the imaging pixel. This variable capacitance of the floating diffusion node increases the dynamic range of the imaging pixel, thereby providing HDR for the host imaging system, as well as increasing the signal-to-noise ratio (SNR) of the imaging system.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1:
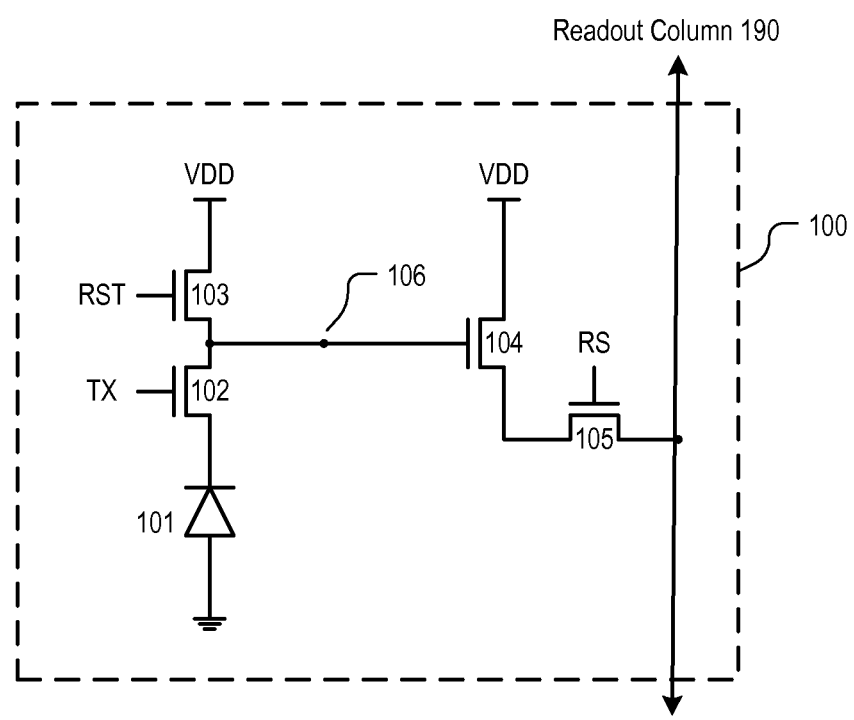
FIG. 1 is a diagram of a prior art four-transistor (4T) pixel cell included within an image sensor array in accordance with an embodiment of the disclosure.

FIG. 1 is a diagram of a four-transistor (4T) pixel cell included within an image sensor array in accordance with an embodiment of the disclosure. Pixel cell 100 includes light sensing element (i.e., photodiode) 101, transfer transistor 102, reset transistor 103, source-follower transistor 104 and row select transistor 105.

During operation, transfer transistor 102 receives transfer signal TX, which transfers the charge accumulated in photodiode 101 to floating diffusion node 106. Reset transistor 103 is coupled between power rail VDD and floating diffusion node 106 to reset pixel cell 100 (e.g., discharge or charge floating diffusion node 106 and photodiode 101 to a preset voltage) under control of reset signal RST.

Floating diffusion node 106 is coupled to control the gate terminal of source-follower transistor 104. Source-follower transistor 104 is coupled between power rail VDD and row select transistor 105. Row select transistor 105 selectively couples the output of pixel circuitry to the readout column 190 under control of row select signal RS.

As described below, HDI for pixel cell 100 is realized by utilizing a control node for resetting floating diffusion node 106 to a reference voltage value and for selectively transferring an image charge from photodiode 101 to readout column 190. In normal operation, photodiode 101 and floating diffusion node 106 are reset by temporarily asserting the reset signal RST and transfer signal TX. The accumulating window (i.e., exposure period) is commenced by de-asserting the transfer signal TX and permitting incident light to charge photodiode 101. As photo-generated electrons accumulate on photodiode 101, its voltage decreases (electrons are negative charge carriers). The voltage or charge on photodiode 101 is indicative of the intensity of the light incident on photodiode 101 during the exposure period. At the end of the exposure period, the reset signal RST is de-asserted to isolate floating diffusion node 106 and transfer signal TX is asserted to couple photodiode 101 to floating diffusion node 106. The charge transfer causes the voltage of floating diffusion node 106 to drop by an amount proportional to photo-generated electrons accumulated on photodiode 101 during the exposure period.

Figure 2:
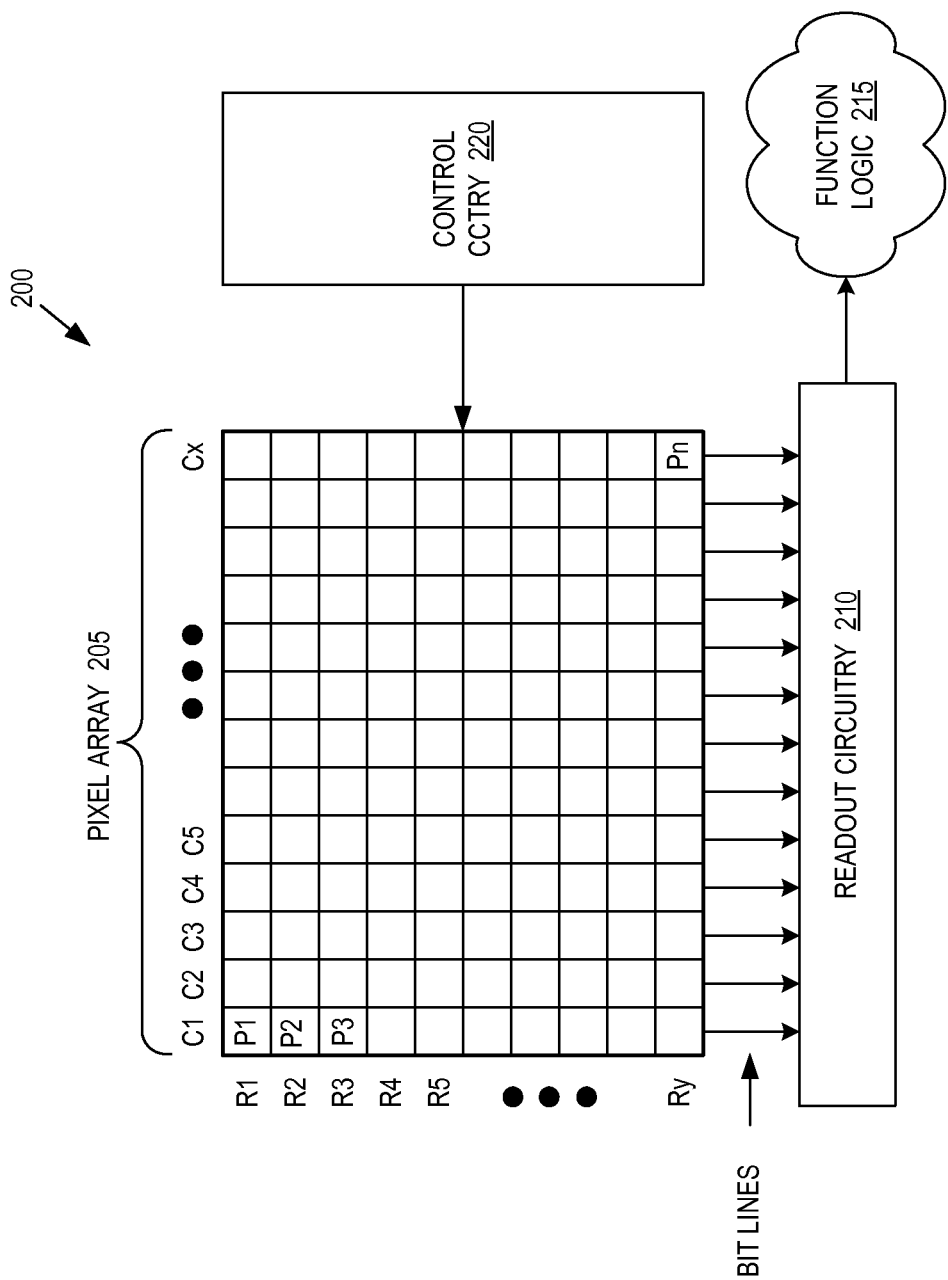
FIG. 2 is a block diagram illustrating an imaging system in accordance with an embodiment of the disclosure.

FIG. 2 is a block diagram illustrating an imaging system in accordance with an embodiment of the disclosure. The illustrated embodiment imaging system 200 includes pixel array 205, readout circuitry 210, function logic 215 and control circuitry 220.

Pixel array 205 is a two-dimensional (2D) array of imaging sensor cells or pixel cells (e.g., pixels P1, P2, . . . , Pn). In one embodiment, each pixel cell is a complementary metal-oxide-semiconductor (CMOS) imaging pixel. In another embodiment, each pixel cell is a charged-coupled device (CCD) imaging pixel. Pixel array 205 may be implemented as a front-side illuminated image sensor or a backside illuminated image sensor. As illustrated, each pixel cell is arranged into a row (e.g., rows R1 to Ry) and a column (e.g., column C1 to Cx) to acquire image data of a person, place or object, which can then be used to render an image of the person, place or object.

After each pixel has acquired its image data or image charge, the image data is readout by readout circuitry 210 and transferred to function logic 215. Readout circuitry 210 may include amplification circuitry, analog-to-digital (ADC) conversion circuitry or otherwise. Function logic 215 may simply store the image data or even manipulate the image data by applying post image effects (e.g., crop, rotate, remove red eye, adjust brightness, adjust contrast or otherwise). In one embodiment, readout circuitry 210 may readout a row of image data at a time along readout column lines (illustrated as generic bit lines) or may readout the image data using a variety of other techniques (not illustrated), such as serial readout, column readout along readout row lines, or a full parallel readout of all pixels simultaneously.

Control circuitry 220 is coupled to pixel array 205 and includes logic for controlling operational characteristics of pixel array 205. For example, reset, row select and transfer signals may be generated by control circuitry 220. Control circuitry 220 may also generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

In one embodiment, imaging system 200 is subsystem included in an electronic system. Said electronic system may be a mobile phone, a computer, a digital camera or a medical device, and may further include an operating unit comprising a computing or processing unit related to the electronic system. For example, said electronic system may be a mobile phone, and said operating unit may be a telephone unit that is responsible for telephone operation of the system.

Figure 3A:
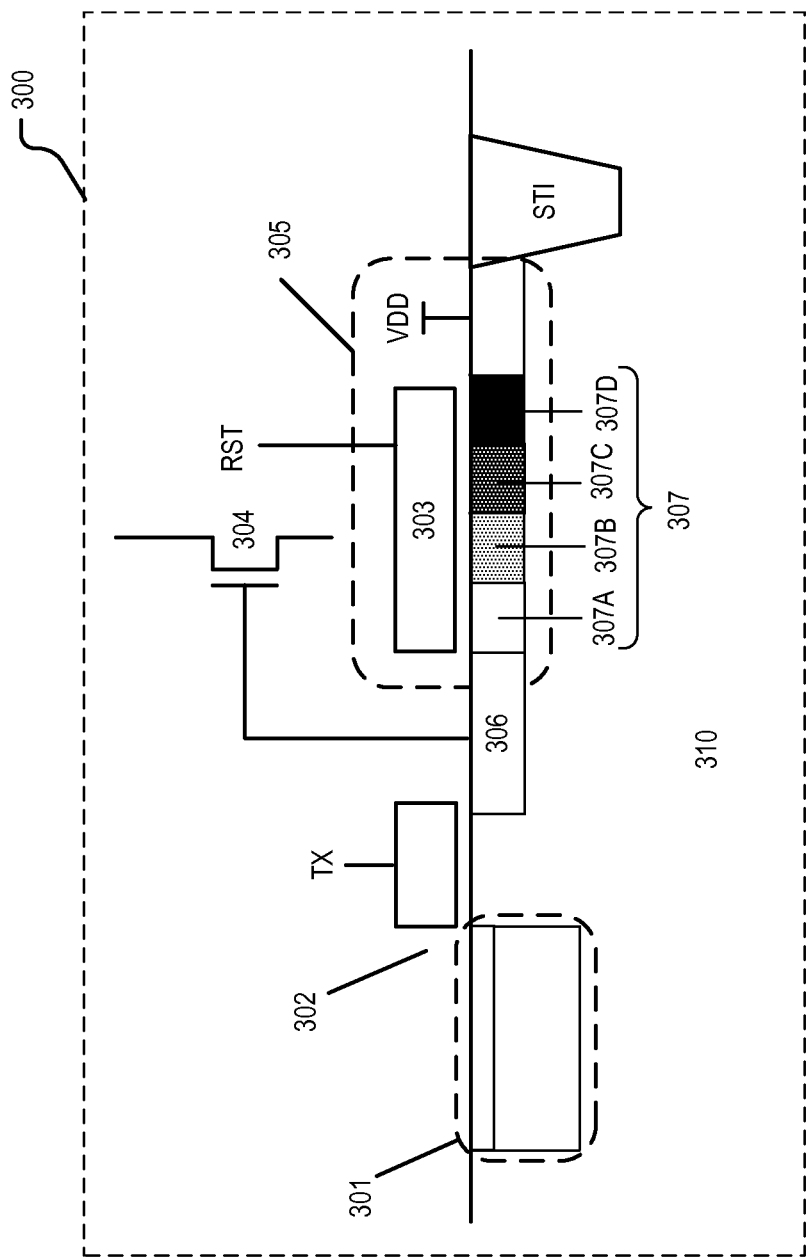
FIG. 3A and FIG. 3B are diagrams of capacitance regions included in a reset transistor of a pixel cell in accordance with embodiments of the disclosure.
Figure 3B:
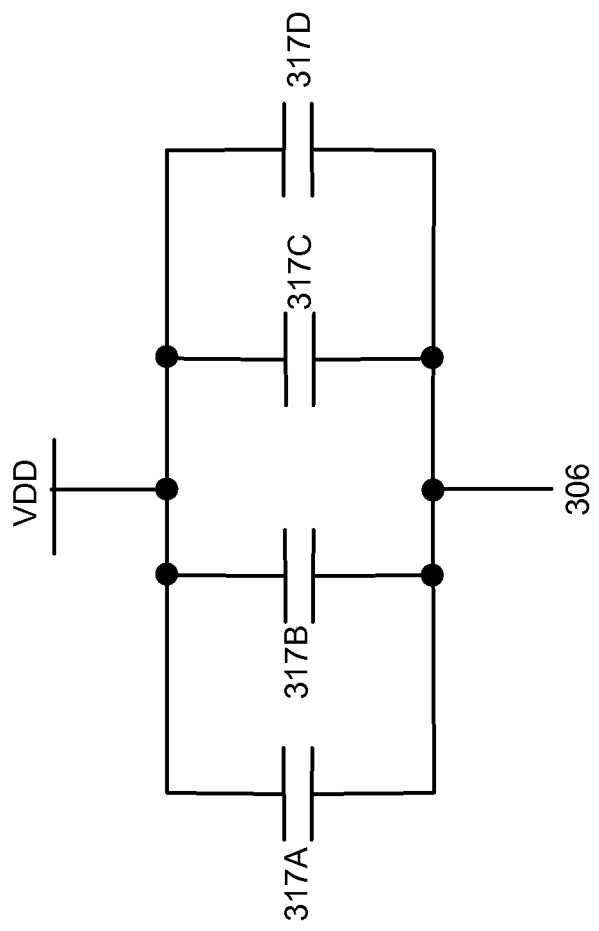

FIG. 3A and FIG. 3B are diagrams of capacitance regions included in a reset transistor of a pixel cell in accordance with embodiments of the disclosure. Pixel cell 300 is included in an array of pixel cells, as described above and illustrated in pixel array 205 of FIG. 2. Pixel cell 300 includes photodiode 301, transfer transistor 302, reset transistor 305 and source-follower transistor 304 formed in substrate 310.

In this embodiment, reset gate 303 of reset transistor 305 is configured to enable in-pixel HDR for pixel 300. Reset gate 303 resets floating diffusion node 306 to a reference voltage value (e.g., based on VDD) in response to receiving signal RST. Reset gate 303 further controls the charge transferred to floating diffusion node 306. In some embodiments, reset transistor 305 comprises a plurality of capacitance regions, shown as regions 307A, 307B, 307C and 307D (collectively regions 307). As described below, the presence of a plurality of capacitance regions allows for the capacitance of floating diffusion node 306 to vary under certain illumination conditions—i.e., when the voltage at floating diffusion node 306 is greater than a threshold voltage value of one of the capacitance regions. Plurality of capacitance regions 307 may be formed from a plurality of dopant regions, each having a different dopant level. For example, one of the dopant regions, 307A, may be doped at a level similar to substrate 310, and the remaining regions may each may have increasing dopant levels.

FIG. 3B is a diagram of capacitance regions included in a reset transistor in accordance with an alternative embodiment of the disclosure. In FIG. 3B, a plurality of MOS capacitors (i.e., capacitors 317A-317D) are coupled in parallel and are coupled to floating diffusion node 306. It is to be understood that in other embodiments, elements 317A-317D may be a plurality of MOS transistors to provide variable capacitance.

In this embodiment, each of capacitors 317A-317D will have different threshold voltage $V_T$ values, thereby contributing to the overall capacitance of floating diffusion node 306 at different voltage levels. In one embodiment, the flat-band voltage $V_{FB}$ value of capacitor 317A may be the same value as the threshold voltage $V_T$ value of 317B, the flat-band voltage $V_{FB}$ value of capacitor 317B may be the same value as the threshold voltage $V_T$ of capacitor 317C, and so forth (although in other embodiments, there may be some overlap of the capacitors' $V_T$-$V_{FB}$ ranges). Furthermore, each of the capacitors may have a minimum capacitance value $C_{MIN}$ close to zero. Thus, the total capacitance at floating diffusion node 306 is a function of the voltage received at the floating diffusion node (i.e., the intensity of the light received at the respective image sensor) for a voltage range of $V_T$ of capacitor 317A to $V_{FB}$ of capacitor 317D, but the capacitance of the floating diffusion node will not be greater than its intrinsic capacitance for voltages lower than $V_T$ of capacitor 317A.

By eliminating the separate capacitor to control floating diffusion charge distribution found in prior art solutions, embodiments of the invention reduce the silicon area used for a pixel cell. The reduction in silicon area reduces device cost, as the amount of silicon area for a device is directly proportional to its manufacturing cost. Furthermore, eliminating the separate transistor for reset functionality reduces the potential parasitic capacitance (e.g., drain to bulk capacitance) for the device, as transistors introduce the potential for parasitic capacitance, which is detrimental to device power consumption, conversion gain and speed performance. Lastly, combining the capacitor and the reset transistor reduces the need for metal routing, thereby allowing for more potential area for photosensitive regions (e.g., photodiodes) and their associated optical path, and an increase in quantum efficiency.

Figure 4:
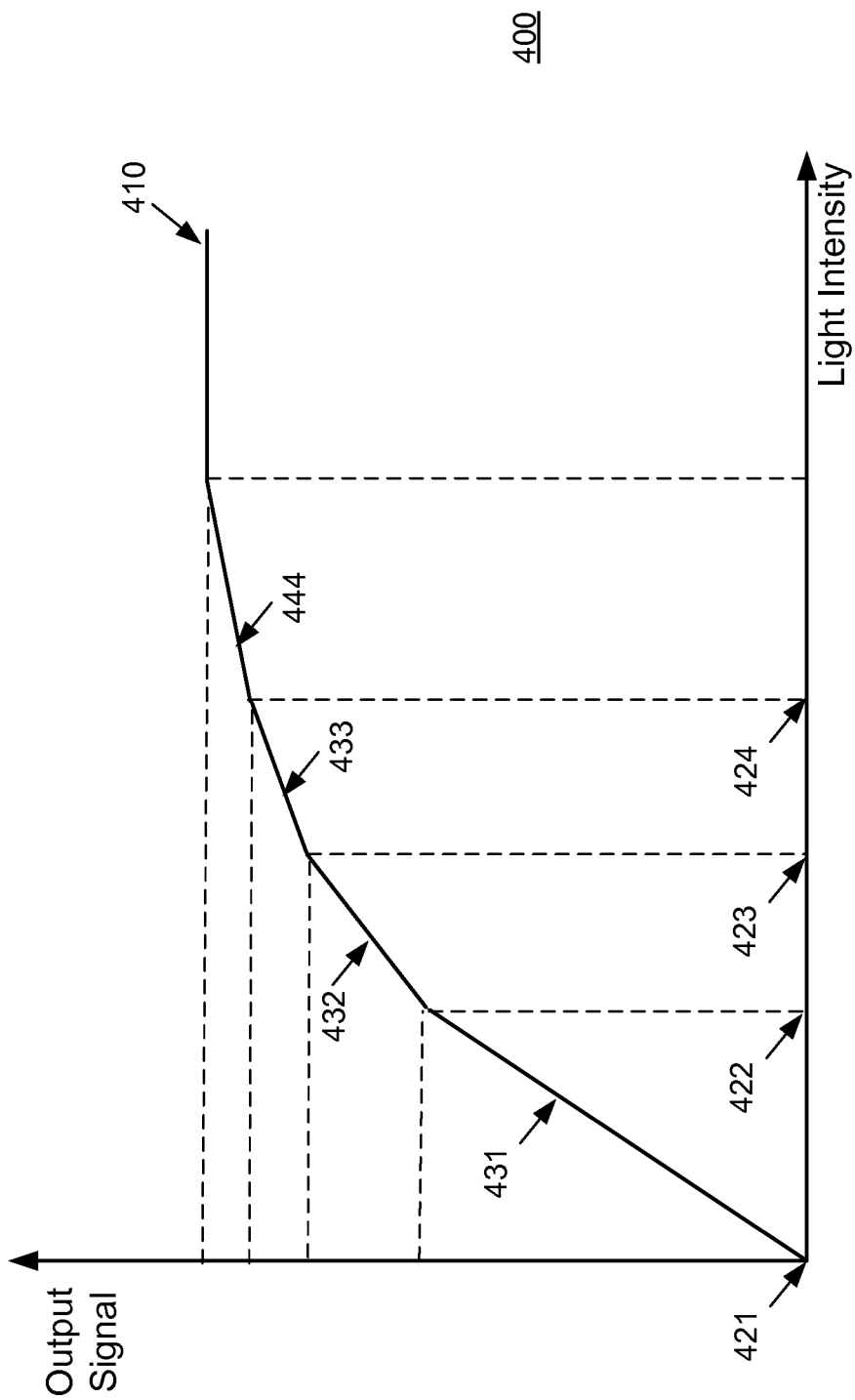
FIG. 4 is a graph showing the relationship between light intensity and output signal of a pixel cell in accordance with an embodiment of the disclosure.

FIG. 4 is a graph showing the relationship between light intensity and signal at the output of the pixel, or the output signal in accordance with an embodiment of the disclosure. Graph 400 includes curve 410 that represents the dynamic range of the pixel cell based on the light intensity received by a corresponding photodiode (it is to be understood that the capacitance at a floating diffusion node of a pixel cell corresponds to the dynamic range of the pixel cell, and is thus also represented by curve 410).

The output signal at light intensity value 421 represents the intrinsic capacitance of a floating diffusion node (e.g., floating diffusion node 306 of FIG. 3). In this embodiment, when light intensity exceeds value 421, the voltage potential at floating diffusion node 306 decreases and a voltage difference will be applied between the floating diffusion node and reset gate 303 that is greater than a threshold voltage value for one of its capacitance regions, formed by the plurality of doping regions in the region of substrate 310 under reset gate 303, thereby providing an output signal shown as segment 431. In this embodiment, when the light intensity approaches value 422, said floating node potential further decreases and the voltage between floating node 306 and reset gate 303 is greater than a threshold voltage value for another of its capacitance region, thereby providing an output signal shown as segment 432.

Similarly, as the light intensity value exceeds values 423 and 424, more capacitors will be turned on continuously from lower Vt to higher Vt.

Figure 5:
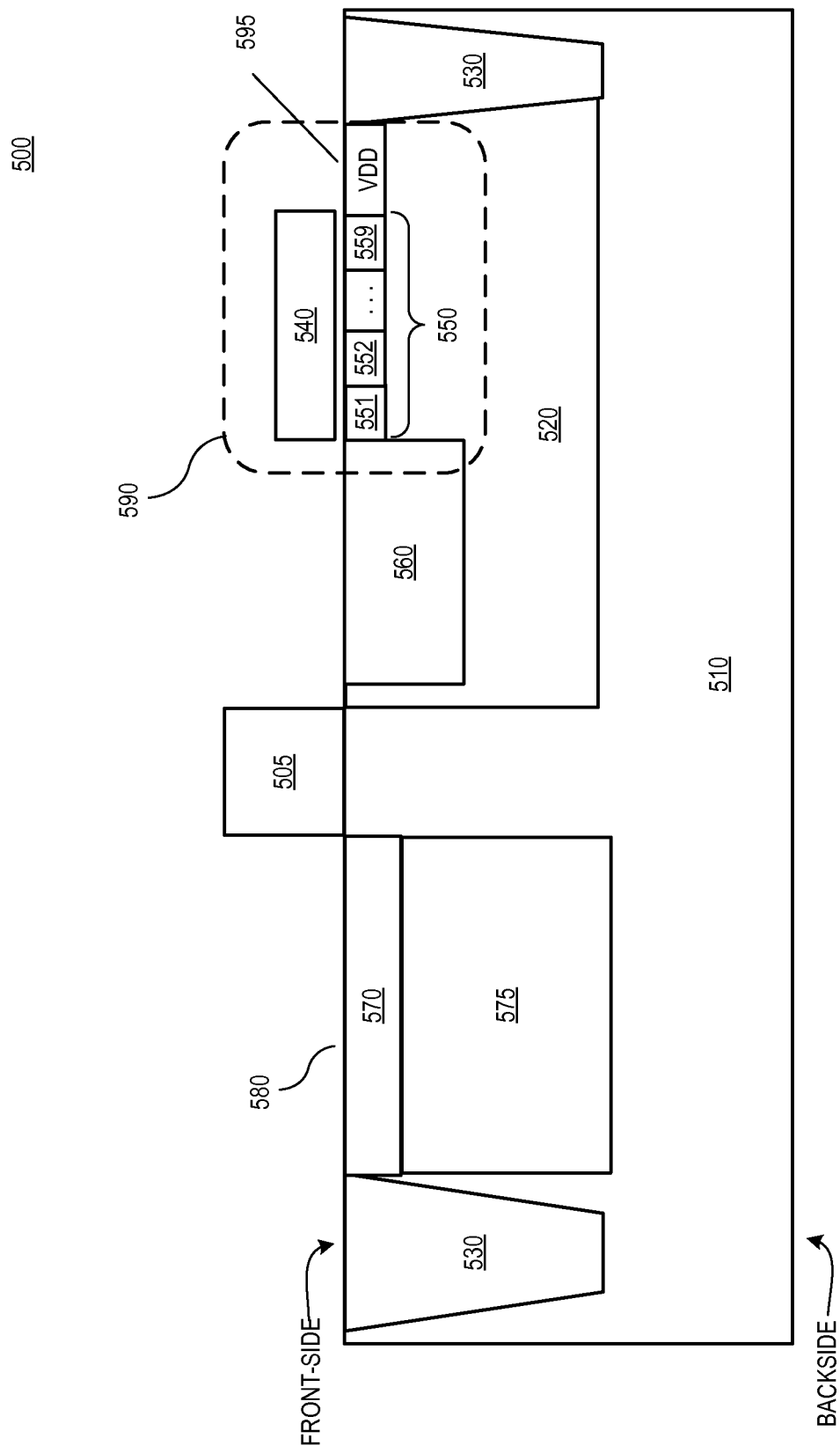
FIG. 5 is a cross-sectional diagram of a pixel cell utilizing a control node having a plurality of dopant regions in accordance with an embodiment of the disclosure.

FIG. 5 is a cross-sectional diagram of a pixel cell utilizing control node having a plurality of dopant regions in accordance with an embodiment of the disclosure. In this embodiment, 4T pixel cell 500 includes photodiode 580 formed on the front-side of substrate 510. As described above, embodiments of the invention may also comprise backside pixel configurations.

In this embodiment, photodiode 580 is comprised of p-type passivation or pinning layer 570 and n-type photosensitive region 575. P-type diffusion well 520 is formed within substrate 510. Floating diffusion 560, reset transistor 590, a source-follower transistor and a row select transistor (not shown) may also be formed within p-type diffusion well 520 or similarly constructed diffusion wells. During operation of pixel 500, transfer transistor 505 receives a transfer signal to transfer the charge accumulated in photodiode 580 to floating diffusion 560. Shallow trench isolation (STI) regions 530 separate pixel 500 from other pixel cells within the respective pixel array.

In this embodiment, under bright light conditions reset transistor 590 includes channel region 550 doped such that it increases the capacitance of floating diffusion node 560. As described above, one way to vary the capacitance provided by reset transistor 590 is to vary the doping levels of the plurality of included conductive regions (shown as regions 551, 552 . . . 559). As described above, when the charge accumulated in photodiode 580 is transferred to floating diffusion 560, the electrical field generated by said charge results in turning on 551-559 sequentially, thereby varying the capacitance of the floating diffusion node depending on the amount of charge in the floating node, or in other words, light intensity exposed to photodiode 580.

In this embodiment, reset transistor 590 includes control node 540 (e.g., a source and drain connection) for controlling charge to floating diffusion node 560 and VDD 595 to control the strength of the electrical field applied to conductive regions 551-559. In this embodiment, control node 540 is combined with reset circuitry and conductive regions 551-559 to save on the silicon area of pixel 500.

In the illustrated embodiment photodiode 580 and other elements of pixel cell 500 are formed in substrate 500. In other embodiments, pixel cell 500 may be formed in an epitaxial layer disposed on the substrate. In other embodiments, pixel cell 500 may have a diffusion region (not shown in FIG. 5) between control node 540 and STI 530.

Conductive regions 551-559 which comprise channel region 550 may have continuous (or nearly continuous) doping levels, thereby creating a range wherein capacitance at floating diffusion node 560 is a function of the amount of charge or light intensity exposed to photodiode 580.

As described above, by having a reset transistor with a channel region comprised of multiple doping levels, a combining reset functionality and charge control node reduces the silicon area used for a pixel cell compared to prior art solutions. This combination reduces device cost, as the amount of silicon area for a device is directly proportional to its manufacturing cost. Combining reset functionality and charge control node also reduces the potential parasitic capacitance (e.g., drain to bulk capacitance) for the device, as transistors introduce the potential for parasitic capacitance, which is detrimental to device power consumption, conversion gain and speed performance. Furthermore, combining reset functionality and charge control node reduces the amount metal routing used for the pixel cell, thereby allowing for more potential area for photosensitive regions (e.g., photodiodes) and their associated optical path, and an increase in quantum efficiency.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

The invention claimed is:

1. An imaging sensor pixel comprising:
a floating diffusion (FD) region;
a photosensitive element to acquire an image charge;
a reset transistor to store the image charge;
a transfer gate to selectively transfer the image charge from the photosensitive element to the FD region; and
a reset gate node coupled to the FD region to control the transfer of the image charge to a readout node, the reset gate node to reset the FD region to a reference voltage, and having a plurality of capacitance regions associated with different threshold voltage values, each of the capacitance regions to have a capacitance value greater than its minimum capacitance value when the image charge transferred to the FD region exceeds its threshold voltage value.

2. The imaging sensor pixel of claim 1, wherein the plurality of capacitance regions of the reset gate node comprises a different dopant level.

3. The imaging sensor pixel of claim 1, wherein each of the plurality of capacitance regions of the reset gate node comprises different maximum capacitance values.

4. The imaging sensor pixel of claim 1, wherein each of the plurality of capacitance regions' minimum capacitance value is zero.

5. The imaging sensor pixel of claim 1, wherein a flat-band voltage of one of the plurality of capacitance regions of the reset gate node is equal to a threshold voltage of another one of the plurality of capacitance regions.

6. The imaging sensor pixel of claim 1, wherein the photosensitive element is disposed within a semiconductor die for accumulating an image charge in response to light incident upon a backside of the imaging sensor pixel.

7. The imaging sensor pixel of claim 1, wherein the photosensitive element is disposed within a semiconductor die for accumulating an image charge in response to light incident upon a front-side of the imaging sensor pixel.

8. The imaging sensor pixel of claim 1, wherein the imaging sensor pixel comprises a complimentary metal-oxide semiconductor (CMOS) image sensor.

9. The imaging sensor pixel of claim 1, wherein the imaging sensor pixel comprises a charged-coupled device (CCD) image sensor.

10. A system comprising:
an array of imaging pixels wherein each imaging pixel includes:
a floating diffusion (FD) region;
a photosensitive element to acquire an image charge;
a reset transistor to store the image charge;
a transfer gate to selectively transfer the image charge from the photosensitive element to the FD region; and
a reset gate node coupled to the FD region to control the transfer of the image charge to a readout node, the reset gate node to reset the FD region to a reference voltage, and having a plurality of capacitance regions associated with different threshold voltage values, each of the capacitance regions to have a capacitance value greater than its minimum capacitance value when the image charge transferred to the FD region exceeds its threshold voltage value;
a controlling unit coupled to the reset gate nodes of the array of imaging pixels to control image data capture of the array of imaging pixels; and
readout circuitry comprising one or more readout nodes and coupled to the array of imaging pixels to readout the image data from each of the imaging pixels.

11. The system of claim 10, wherein, for each imaging pixel of the array of imaging pixels, each capacitance region comprises a different dopant level.

12. The system of claim 10, wherein, for each imaging pixel of the array of imaging pixels, a flat-band voltage of one of the plurality of capacitance regions is equal to a threshold voltage of another one of the plurality of capacitance regions.

13. The system of claim 10, wherein, for each imaging pixel of the array of imaging pixels, each of the plurality of capacitance regions comprises different maximum capacitance values.

14. The system of claim 10, wherein, for each imaging pixel of the array of imaging pixels, each of the plurality of capacitance regions' minimum capacitance value is zero.

15. The system of claim 10, wherein, for each imaging pixel of the array of imaging pixels, the photosensitive element is disposed within a semiconductor die for accumulating an image charge in response to light incident upon a backside of the imaging pixel.

16. The system of claim 10, wherein, for each imaging pixel of the array of imaging pixels, the photosensitive element is disposed within a semiconductor die for accumulating an image charge in response to light incident upon a front-side of the imaging pixel.

17. The system of claim 10, wherein each of the imaging pixels comprises a complimentary metal-oxide semiconductor (CMOS) image sensor.

18. The system of claim 10, wherein each of the imaging pixels comprises a charged-coupled device (CCD) image sensor.

* * * * *